(12) United States Patent
Starkston et al.

(10) Patent No.: US 11,114,353 B2
(45) Date of Patent: Sep. 7, 2021

(54) HYBRID MICROELECTRONIC SUBSTRATES

(71) Applicant: Intel Corporation, Santa Clara, CA (US)

(72) Inventors: Robert Starkston, Phoenix, AZ (US); Robert L. Sankman, Phoenix, AZ (US); Scott M. Mokler, Hillsboro, OR (US); Richard Christopher Stamey, Portland, OR (US); Amruthavalli Pallavi Alur, Tempe, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/080,093

(22) PCT Filed: Mar. 30, 2016

(86) PCT No.: PCT/US2016/024827
§ 371 (c)(1),
(2) Date: Aug. 27, 2018

(87) PCT Pub. No.: WO2017/171738
PCT Pub. Date: Oct. 5, 2017

(65) Prior Publication Data
US 2019/0057915 A1 Feb. 21, 2019

(51) Int. Cl.
*H01L 23/13* (2006.01)
*H01L 23/498* (2006.01)
(Continued)

(52) U.S. Cl.
CPC ............ *H01L 23/13* (2013.01); *H01L 23/485* (2013.01); *H01L 23/488* (2013.01);
(Continued)

(58) Field of Classification Search
CPC ................ H01L 23/5383; H01L 23/13; H01L 2924/15153
See application file for complete search history.

(56) References Cited

U.S. PATENT DOCUMENTS

| 5,646,828 A | 7/1997 | Degani et al. |
| 5,919,329 A * | 7/1999 | Banks ............... H01L 21/486 |
| | | 156/281 |

(Continued)

FOREIGN PATENT DOCUMENTS

| EP | 2075834 A1 | 7/2009 |
| JP | 2007027483 A | 2/2007 |

(Continued)

OTHER PUBLICATIONS

Deo, Manish, "Enabling Next-Generation Platforms Using Altera's 3D System-in-Packaging Technology," White Paper, Altera, Jun. 2015, 11 pages.

(Continued)

*Primary Examiner* — Dale E Page
*Assistant Examiner* — Wilner Jean Baptiste
(74) *Attorney, Agent, or Firm* — Patent Capital Group

(57) ABSTRACT

Hybrid microelectronic substrates, and related devices and methods, are disclosed herein. In some embodiments, a hybrid microelectronic substrate may include a low-density microelectronic substrate having a recess at a first surface, and a high-density microelectronic substrate disposed in the recess and coupled to a bottom of the recess via solder.

20 Claims, 6 Drawing Sheets

(51) Int. Cl.
  *H01L 23/538* (2006.01)
  *H01L 23/488* (2006.01)
  *H01L 23/485* (2006.01)
(52) U.S. Cl.
  CPC .... *H01L 23/49816* (2013.01); *H01L 23/5383* (2013.01); *H01L 23/5385* (2013.01); *H01L 2224/16225* (2013.01); *H01L 2924/15311* (2013.01)

(56) References Cited

U.S. PATENT DOCUMENTS

| | | | | |
|---|---|---|---|---|
| 6,324,067 | B1* | 11/2001 | Nishiyama | H05K 1/165 174/262 |
| 6,709,898 | B1* | 3/2004 | Ma | H01L 23/3128 257/675 |
| 7,253,516 | B2* | 8/2007 | Coenen | H01L 23/50 257/691 |
| 10,529,697 | B2* | 1/2020 | Cheng | H01L 23/5389 |
| 10,867,924 | B2* | 12/2020 | Jeng | H01L 21/76885 |
| 2002/0020554 | A1 | 2/2002 | Sakamoto et al. | |
| 2010/0258920 | A1* | 10/2010 | Chien | H01L 23/49582 257/666 |
| 2012/0020026 | A1* | 1/2012 | Oganesian | H01L 25/16 361/707 |
| 2012/0067636 | A1 | 3/2012 | Kim et al. | |
| 2013/0032390 | A1* | 2/2013 | Hu | H01L 23/13 174/266 |
| 2015/0084210 | A1 | 3/2015 | Chiu et al. | |
| 2015/0187692 | A1 | 7/2015 | Tseng et al. | |
| 2015/0340353 | A1 | 11/2015 | Starkston et al. | |

FOREIGN PATENT DOCUMENTS

| | | |
|---|---|---|
| KR | 20120000483 A | 1/2012 |
| KR | 20140080114 A | 6/2014 |
| WO | 2017171738 A1 | 10/2017 |

OTHER PUBLICATIONS

European Extended Search Report in European Patent Application No. 16897295.8 dated Aug. 28, 2019, 11 pages.
Fuhan, "Ulta-high density, thin core and low loss organic system-on-package (SOP) substrate technology for mobile applicaions", Electronic Components and Technology Conference, 2009, ECTC 2009. 59th, IEEE, Piscataway, NJ, USA May 26, 2009, pp. 612-617.
International Search Report and Written Opinion issued in PCT Application No. PCT/US2016/024827 dated Nov. 21, 2016, 13 pages.
European Patent Office Action in European Patent Application No. 16897295.8 dated Jun. 22, 2020, 6 pages.

* cited by examiner

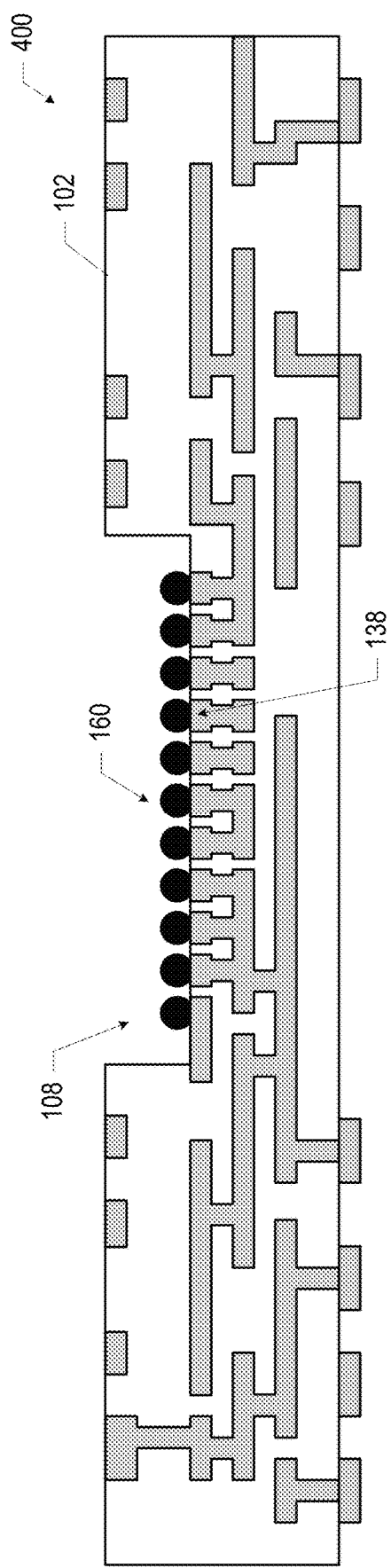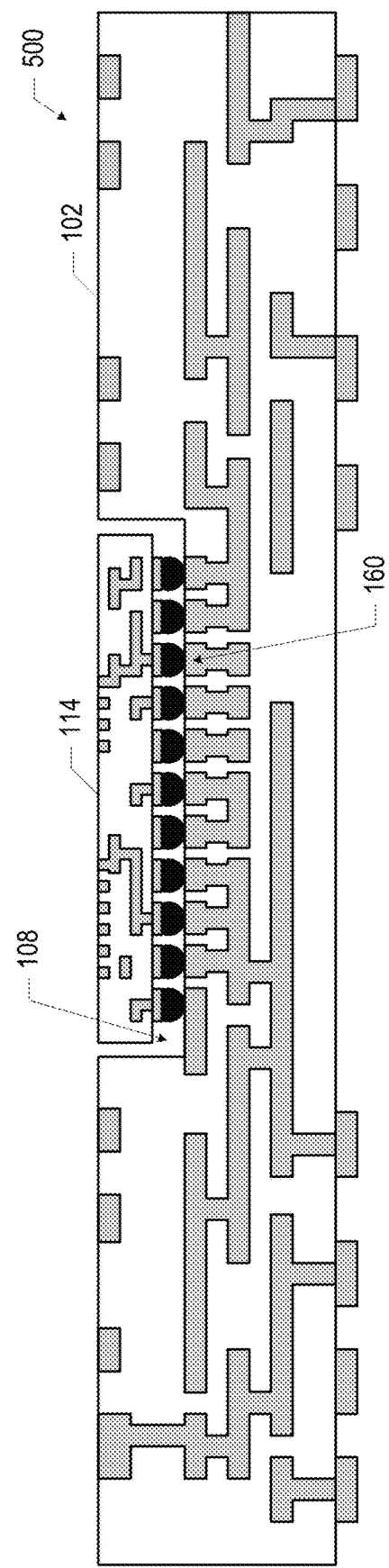

HYBRID MICROELECTRONIC SUBSTRATES

CROSS-REFERENCE TO RELATED APPLICATION

This application is a national stage application under 35 U.S.C. § 371 of PCT International Application Serial No. PCT/US2016/024827, filed on Mar. 30, 2016 and entitled "HYBRID MICROELECTRONIC SUBSTRATES," which is hereby incorporated by reference in its entirety.

TECHNICAL FIELD

The present disclosure relates generally to the field of microelectronic assemblies, and more particularly, to hybrid microelectronic substrates.

BACKGROUND

Microelectronic devices (e.g., dies) are conventionally packaged to achieve a package interconnect pitch that matches a pitch achievable by a substrate to which the microelectronic device will be coupled. The pitch achievable by conventional substrates is limited by manufacturing, materials, and thermal considerations, with smaller pitches having significantly higher costs.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIGS. 2-8 are side, cross-sectional views of various assemblies in the manufacture of a microelectronic assembly including an HMS, in accordance with various embodiments.

DETAILED DESCRIPTION

Figure 1:
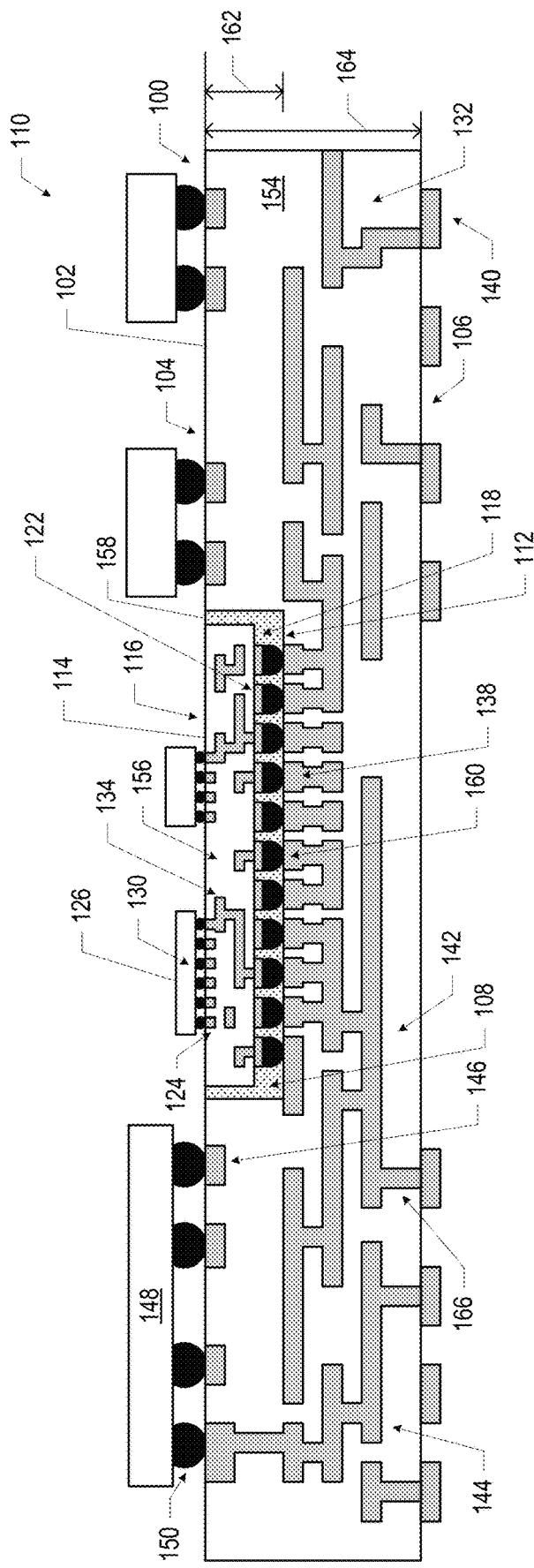
FIG. 1 is a side, cross-sectional view of a microelectronic assembly including a hybrid microelectronic substrate (HMS), in accordance with various embodiments.

Hybrid microelectronic substrates (HMSs), and related devices and methods, are disclosed herein. In some embodiments, an HMS may include a low-density microelectronic substrate (LDMS) having a recess at a first surface, and a high-density microelectronic substrate (HDMS) disposed in the recess and coupled to a bottom of the recess via solder.

Various ones of the embodiments disclosed herein may help achieve reliable attachment between a microelectronic device (e.g., an integrated circuit (IC) die) and a substrate at a lower cost and with improved efficiency relative to conventional approaches. As microelectronic devices (and their pitch) decrease in size, it becomes difficult to attach these devices to their substrates. One way to address this difficulty may be to fabricate the microelectronic substrate entirely with high density electrical routing. However, such high density electrical routing may require time-consuming lithography processes that may be an order of magnitude more expensive than the process is used for fabricating lower-density substrates, such as printed circuit boards (PCBs). Another way to address the attachment challenge may be to fabricate an interposer, such as a silicon interposer, to position between an IC die and the substrate. Such interposers may be used to connect the microelectronic device to the microelectronic substrate by providing electrical routes that are high density in the area of the microelectronic device, and which spread or fan out through the interposer to a lower density at the microelectronic substrate. However, fabrication of a silicon interposer may be expensive, and the use of an interposer may increase the "height" of a microelectronic assembly. Additionally, since silicon interposers are not as insulating as PCBs, silicon interposers may introduce losses that do not arise when PCBs are used.

The HMSs disclosed herein may incorporate an HDMS as a "patch" within an LDMS. A flip chip die or other microelectronic device with high-density interconnects may be directly attached to the HDMS in the HMS, while allowing for lower-density interconnects and electrical routes in the LDMS (where high-density interconnects are not required). For example, the LDMS may be a PCB, and the HDMS may be a higher-density patch embedded in a cavity in the PCB to provide local high-density routing. The structures disclosed herein may enable components coupled to the HMS to be in close proximity, providing for better power delivery and signal speed while miniaturizing the entire system for small and low-profile applications in computers, tablets, industrial robots, and consumer electronics (e.g., wearable devices).

In some embodiments, the HDMS may include conductive pathways to route power and signals for a microelectronic device coupled to the HDMS, and may not contain active or passive circuitry. In other embodiments, the HDMS may include active or passive circuitry beyond the conductive pathways (e.g., transistors, diodes, resistors, inductors, and capacitors).

As used herein, the term "lower density" in LDMS is relative to the term "high density" in HDMS in that the conductive pathways (e.g., including conductive traces and conductive vias) of the LDMS are larger and have a greater pitch than the conductive pathways (e.g., including conductive traces and conductive vias) of the HDMS. For example, in some embodiments, an HDMS may have a line or space pitch of approximately 10 microns, while an associated LDMS may have a line or space pitch of approximately 40-50 microns. In some embodiments, an HDMS may have a line or space pitch of less than 20 microns, while an associated LDMS may have a line or space pitch greater than 40 microns. In some embodiments, an HDMS may be manufactured using a modified semi-additive process or a semi-additive buildup process with advanced lithography (with small vertical interconnect features formed by advanced laser or lithography processes), while an LDMS may be a PCB manufactured using a standard PCB process (e.g., a standard subtractive process using etch chemistry to remove areas of unwanted copper, and with coarse vertical interconnect features formed by a standard laser process).

In the following detailed description, reference is made to the accompanying drawings that form a part hereof wherein like numerals designate like parts throughout, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. The drawings are not necessarily to scale.

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous.

FIG. 1 is a side, cross-sectional view of a microelectronic assembly 110 including an HMS 100, in accordance with various embodiments. The HMS 100 may include an LDMS 102 having a recess 108 at a first surface 104, and in HDMS 114 disposed in the recess 108 and coupled to a bottom surface 112 of the recess 108 via solder interconnects 160.

The HDMS 114 may include a dielectric material 156 (e.g., formed in multiple layers, as known in the art) and multiple conductive pathways 134, formed through the dielectric material 156. The conductive pathways 134 in the HDMS 114 may include conductive traces, and/or conductive vias, as shown. The HDMS 114 may have a first surface 116 and an opposing second surface 118. Multiple conductive contacts 124 may be disposed at the first surface 116, and multiple conductive contacts 122 may be disposed at the second surface 118. The conductive contacts 124 and/or the conductive contacts 122 may include bond pads or any other suitable conductive contact, for example. At least one conductive pathway 134 may extend between a conductive contact 124 (at the first surface 116) and a conductive contact 122 (at the second surface 118). Multiple such conductive pathways 134 are illustrated in FIG. 1.

Solder interconnects 160 may couple the conductive contacts 122 of the HDMS 114 to respective conductive contacts 138 of the LDMS 102. The conductive contacts 138 may be disposed at the bottom surface 112 of the recess 108. The LDMS 102 may include other conductive contacts 146 disposed on the first surface 104, as well as conductive contacts 140 disposed on a second surface 106 of the LDMS 102 (opposite to the first surface 104). The LDMS 102 may include a dielectric material 154 (e.g., formed in multiple layers, as known in the art) and one or more conductive pathways 132 through the dielectric material 154 (e.g., including conductive traces and/or conductive vias, as shown). In particular, conductive vias included in the conductive pathways 132 in the LDMS 102 may be filled vias, such as the filled via 166. In some embodiments, one or more of the conductive pathways 132 may extend between a conductive contact 146 at the first surface 104 and a conductive contact 140 at the second surface 106. An example of such a conductive pathway 132 is the conductive pathway 144 illustrated in FIG. 1. In some embodiments, one or more of the conductive pathways 132 may extend between a conductive contact 138 at the bottom surface 112 of the recess 108 and a conductive contact 140 at the second surface 106. An example of such a conductive pathway 132 is the conductive pathway 142 illustrated in FIG. 1. In some embodiments, one or more of the conductive pathways 132 may extend between a conductive contact 146 at the first surface 104 of the LDMS 102 and a conductive contact 138 at the bottom surface 112 of the recess 108 of the LDMS 102 (not shown in FIG. 1).

In some embodiments, an underfill material 158 may be disposed around the solder interconnects 160 between the HDMS 114 and the bottom surface 112 of the recess 108. In some embodiments, this underfill material 158 may extend up around the sides of the HDMS 114 in the recess 108 (e.g., as illustrated in FIG. 1). The underfill material 158 may include any suitable material, such as an epoxy material. Various example embodiments of the underfill material 158 are also discussed below with reference to FIG. 6.

One or more microelectronic devices 126 may be coupled to the first surface 116 of the HDMS 114. In particular, a microelectronic device 126 may be electrically coupled to the conductive contacts 124 by interconnects 130. In some embodiments, the microelectronic device 126 may be an unpackaged die, and/or the interconnects 130 may include small conductive bumps or pillars (e.g., copper bumps or pillars) attached to the conductive contacts 124 by solder. Using an unpackaged die as the microelectronic device 126 may achieve the smallest form factor, but the interconnects of such a microelectronic device 126 may have too fine a pitch to couple to the LDMS 102. In some embodiments, a microelectronic device 126 coupled to the first surface 116 of the HDMS 114 may be in electrical contact with one or more of the conductive contacts 140 on the second surface 106 of the LDMS 102 via an interconnect 130, a conductive contact 124 of the HDMS 114, a conductive pathway 134 in the HDMS 114, a conductive contact 122 of the HDMS 114, a solder interconnect 160, and a conductive pathway 132 (e.g., the conductive pathway 142) in the LDMS 102. In some embodiments, a microelectronic device 126 coupled to the first surface 116 of the HDMS 114 may be an electrical contact with one or more of the conductive contacts 146 on the first surface 104 of the LDMS 102 via a similar set of pathways.

One or more microelectronic devices 148 may be coupled to the first surface 104 of the LDMS 102. In particular, a microelectronic device 148 may be electrically coupled to the conductive contacts 146 by interconnects 150. In some embodiments, the microelectronic device 148 may be a packaged or unpackaged die, and/or the interconnects 150 may include solder balls or other suitable structures. In some embodiments, a microelectronic device 148 coupled to the first surface 104 of the LDMS 102 may be an electrical contact with one or more of the conductive contacts 140 on the second surface 106 of the LDMS 102 via an interconnect 150, a conductive contact 146, and a conductive pathway 132 (e.g., the conductive pathway 144) in the LDMS 102. Although not illustrated in FIG. 1, in some embodiments, one or more microelectronic devices may be coupled to the second surface 106, in addition to or instead of to the first surface 104, of the LDMS 102.

The LDMS 102 may have a thickness 164, as measured between the first surface 104 and the second surface 106. The thickness 164 may take any desired value. In some embodiments, the thickness 164 may be between 0.25 and 1 millimeter (e.g., between 0.25 and 0.75 millimeters, or between 0.4 and 0.6 millimeters, or approximately 0.5 millimeters).

The recess 108 may have a depth 162, as measured between the plane of the first surface 104 and the bottom surface 112 of the recess 108. The depth 162 may take any desired value. In some embodiments, the depth 162 may be between 50 and 150 microns (e.g., between 50 and 100 microns, between 60 and 80 microns, or approximately 75 microns). In some embodiments, the depth 162 may be equal to a certain number of layers of the dielectric material 154 in the LDMS 102. For example, the depth 162 may be approximately equal to between two and five layers of the dielectric material 154 (e.g., three layers of the dielectric material 154). In some embodiments, the first surface 116 of the HDMS 114 may be substantially coplanar with the first surface 104 of the LDMS 102. In other embodiments, the first surface 116 of the HDMS 114 may be recessed below the first surface 104 of the LDMS 102, or may extend above the first surface 116 of the LDMS 102. Although FIG. 1 illustrates a microelectronic assembly 110 having a single recess 108 in the LDMS 102, the LDMS 102 may include multiple recesses 108, having the same or different dimensions, and each having an HDMS 114 disposed therein. Multiple recesses 108 may all be disposed on the first surface 104, all disposed on the second surface 106, or on both the first surface 104 and the second surface 106.

Although FIG. 1 illustrates a specific number and arrangement of conductive pathways 134 and conductive contacts 122/124 in the HDMS 114, these are simply illustrative and any suitable number and arrangement may be used. Similarly, although FIG. 1 illustrates a specific number and arrangement of conductive pathways 132 and conductive contacts 146/140 in the LDMS 102, these are simply illustrative in any suitable number and arrangement may be used. The conductive pathways 134/132 (e.g., conductive traces and/or conductive vias) may be formed of any appropriate conductive material, such as copper, silver, nickel, gold, aluminum, or other metals or alloys, for example.

The dielectric material 156 of the HDMS 114 may include any suitable material, such as bismaleimide triazine (BT) resin, polyimide materials, glass reinforced epoxy matrix materials, or low-k and ultra low-k dielectric (e.g., carbon-doped dielectrics, fluorine-doped dielectrics, porous dielectrics, and organic polymeric dielectrics). For example, the dielectric material 156 of the HDMS 114 may include a dielectric buildup film, such as Ajinomoto buildup film (ABF). The dielectric material 154 of the LDMS 102 may include any suitable material, such as fire retardant grade 4 material (FR-4), bismaleimide triazine (BT) resin, polyimide materials, glass reinforced epoxy matrix materials, or low-k and ultra low-k dielectric (e.g., carbon-doped dielectrics, fluorine-doped dielectrics, porous dielectrics, and organic polymeric dielectrics). In particular, when the LDMS 102 is formed using standard PCB processes, the dielectric material 154 may include FR-4, and the conductive pathways 132 may be formed by patterned sheets of copper separated by buildup layers of the dielectric material 154. In some embodiments, the dielectric material 154 may be the same as the dielectric material 156, while in other embodiments, the dielectric material 154 may be different from the dielectric material 156. The solder interconnects 160 may be formed of any appropriate solder material, such as lead/tin, tin/bismuth, eutectic tin/silver, ternary tin/silver/copper, eutectic tin/copper, or other alloys.

The HDMS 114 may thus provide a substrate for high-density interconnect routing in a localized area of the HMS 100. In some embodiments, the presence of the HDMS 114 may support direct chip attach of fine pitch semiconductor dies that cannot be attached directly to the LDMS 102. In particular, as discussed above, the HDMS 114 may support trace widths and spacing that are not achievable in the LDMS 102. The proliferation of wearable and mobile electronics, as well as Internet of Things (IoT) applications, are driving reductions in the size of electronic systems, but limitations of the PCB manufacturing process and the mechanical consequences of thermal expansion during use have meant that chips having fine interconnect pitch cannot be directly mounted to a PCB. Various embodiments of the HMS 100 disclosed herein may provide microelectronic substrates capable of supporting chips with high-density interconnects and chips with low-density interconnects without sacrificing performance or manufacturability.

FIGS. 2-8 are side, cross-sectional views of various assemblies in the manufacture of a microelectronic assembly including an HMS 100, in accordance with various embodiments. Although the operations discussed below with FIGS. 2-8 are illustrated in a particular order, these operations may be performed in any suitable order. Additionally, although particular assemblies are illustrated in FIGS. 2-8, the operations discussed below with reference to FIGS. 2-8 may be used to form any suitable assemblies (e.g., any of the embodiments discussed above with reference to FIG. 1).

Figure 2:
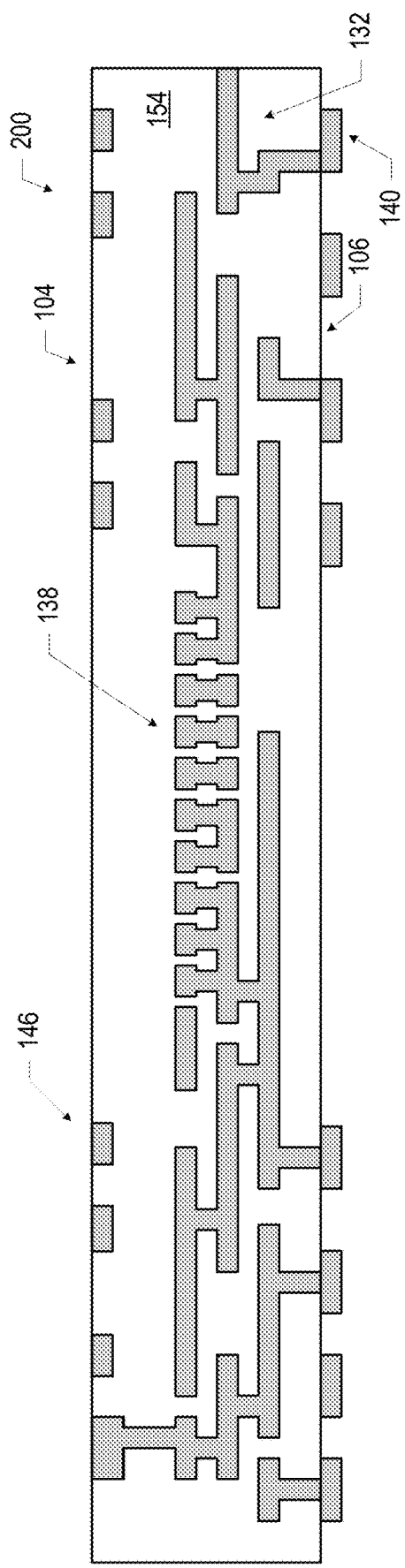

FIG. 2 illustrates an LDMS 200. The LDMS 200 may be structurally similar to the LDMS 102 of FIG. 1, but may not include the recess 108 of the LDMS 102. In particular, the LDMS 200 may include one or more conductive contacts 146 disposed at the first surface 104, one or more conductive contacts 140 disposed at the second surface 106, and various conductive pathways 132 extending through the dielectric material 154. The LDMS 200 may also include conductive contacts 138 located between the first surface 104 and the second surface 106 (and therefore not "exposed" at the exterior of the LDMS 200). These components may take the form of any of the embodiments disclosed herein. Any method known in the art for fabrication of the LDMS 200 may be used, and for the sake of brevity, such methods will not be discussed in detail herein. In some embodiments, the LDMS 200 may be manufactured using standard PCB manufacturing processes, and thus the LDMS 200 may take the form of a PCB, as discussed above.

Figure 3:
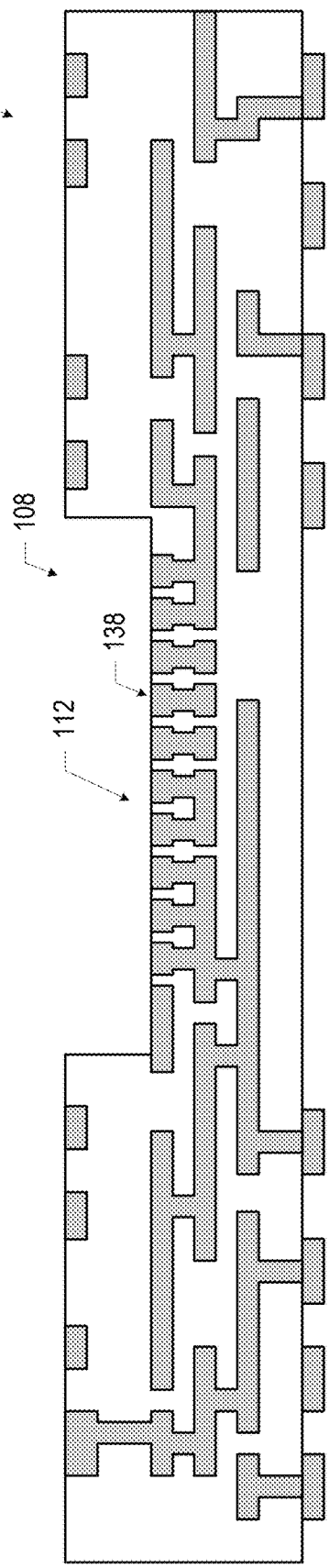

FIG. 3 illustrates the LDMS 102, formed by forming a recess 108 in the LDMS 200 (FIG. 2). As discussed above with reference to FIG. 1, the recess 108 extends down to the conductive contacts 138, and may have a bottom surface 112 at which the conductive contacts 138 are exposed. Any suitable technique may be used to form the recess 108. For example, in some embodiments, the recess 108 may be laser-drilled down to a planar metal stop in the LDMS 200 (not shown); once the metal stop is reached, the metal stop may be removed to expose the conductive contacts 138. In some embodiments, the recess 108 may be formed by a mechanical drill. The components of the LDMS 102 of FIG. 3 may take the form of any of the embodiments disclosed herein.

FIG. 4 illustrates a microelectronic assembly 400 subsequent to providing solder interconnects 160 to the exposed conductive contacts 138 in the recess 108 of the LDMS 102 (FIG. 3). The solder interconnects 160 may take any suitable form, such as solder balls or bumps. In other embodiments, the solder interconnects 160 may not be provided to the conductive contacts 138 separately from coupling the HDMS 114 to the LDMS 102 (discussed below with reference to FIG. 5), but instead, the solder interconnects 160 may be provided to the recess 108 already coupled to the HDMS 114.

FIG. 5 illustrates a microelectronic assembly 500 subsequent to providing an HDMS 114 in the recess 108 of the LDMS 102 (FIG. 4) and coupling the HDMS 114 to the LDMS 102 via the solder interconnects 160. The microelectronic assembly 500 may be an embodiment of an HMS 100. The HDMS 114 may take the form of any of the embodiments discussed above with reference to FIG. 1. Any suitable technique may be used to couple the HDMS 114 to the LDMS 102 via the solder interconnects 160. For example, in some embodiments, the HDMS 114 may be coupled to the LDMS 102 using a mass reflow process. In other embodiments, the HDMS 114 may be coupled to the LDMS 102 using a thermal compression bonding process. Any method known in the art for fabrication of the HDMS 114 may be used, and for the sake of brevity, such methods will not be discussed in detail herein. However, it is noted that, in some embodiments, conventional die attach tools may be used to couple the HDMS 114 to the LDMS 102 in the recess 108, making such embodiments of the HMS 100 more readily manufacturable than other structures that may require new or complex tooling.

Figure 6:
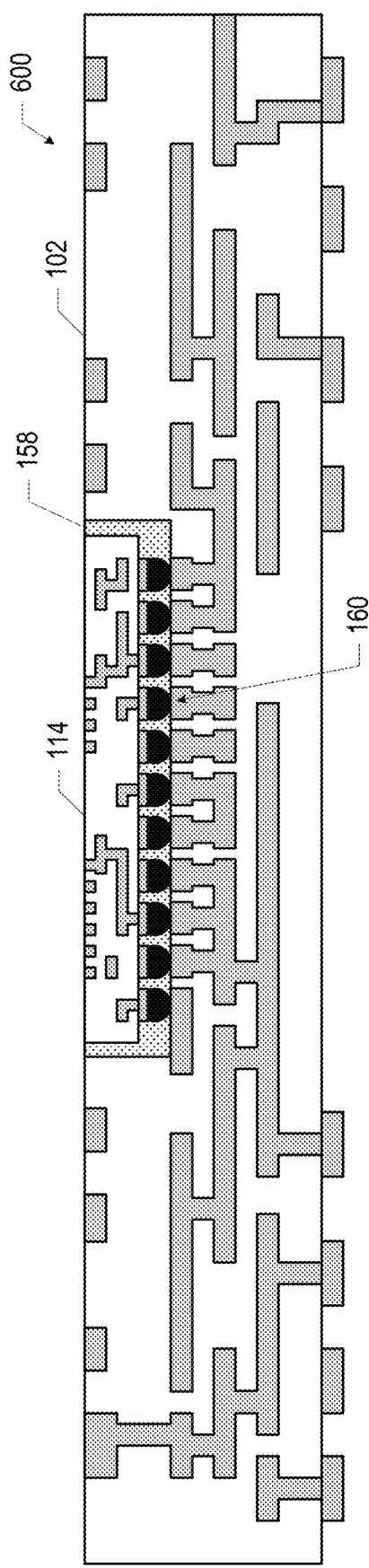

FIG. 6 illustrates a microelectronic assembly 600 subsequent to providing an underfill material 158 around the solder interconnects 160 of the HMS 100 (FIG. 5). The microelectronic assembly 600 may be an embodiment of an HMS 100. The underfill material 158 may, in some embodiments, extend up and around the sides of the HDMS 114. Any suitable underfill material 158 may be used. For example, in some embodiments, the underfill material 158 may be provided by capillary underfill (e.g., in conjunction with a mass reflow process). In other embodiments, the underfill material 158 may be an epoxy flux that assists with soldering the HDMS 114 to the LDMS 102 (as discussed above with reference to FIG. 5) and then polymerizes and encapsulates the solder interconnects 160 in the recess 108. The underfill material 158 may be selected to have a coefficient of thermal expansion (CTE) that may mitigate or minimize the stress between the HDMS 114 and the LDMS 102 arising from uneven thermal expansion in the finished device. In some embodiments, the CTE of the underfill material 158 may have a value that is intermediate to the CTE of the LDMS 102 (e.g., the CTE of the dielectric material 154 of the LDMS 102) and a "composite" CTE of the HDMS 114 (e.g., the CTE of the dielectric material 156 of the HDMS 114) and any microelectronic devices 126 (and optionally underfill) coupled to the HDMS 114 (as discussed below with reference to FIG. 7). In some embodiments, no underfill material 158 may be included.

Figure 7:
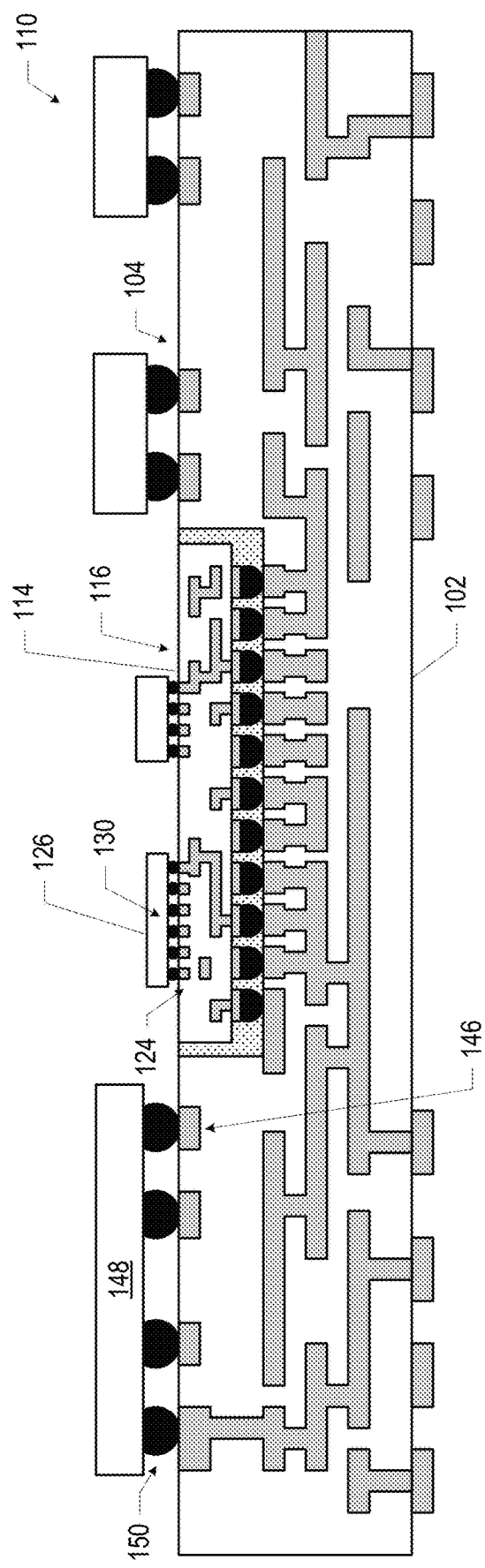

FIG. 7 illustrates the microelectronic assembly 110 subsequent to coupling one or more microelectronic devices 126 to the conductive contacts 124 at the first surface 116 of the HDMS 114 of the microelectronic assembly 600 (FIG. 6) via the interconnects 130 (e.g., using a mass reflow or thermal compression bonding technique), and coupling one or more microelectronic devices 148 to the conductive contacts 146 at the first surface 104 of the LDMS 102 via the interconnects 150 (e.g., using a mass reflow surface mount technique). The components of the microelectronic assembly 110 of FIG. 7 may take the form of any of the embodiments disclosed herein. The microelectronic assembly 110 may serve as a system-in-package (SiP) in which multiple microelectronic devices having different functionality (e.g., the microelectronic devices 126 and 148) are all coupled to the HMS 100, and the HMS 100 acts as an SiP substrate. In such embodiments, the microelectronic assembly 110 may be referred to as an SiP.

Figure 8:
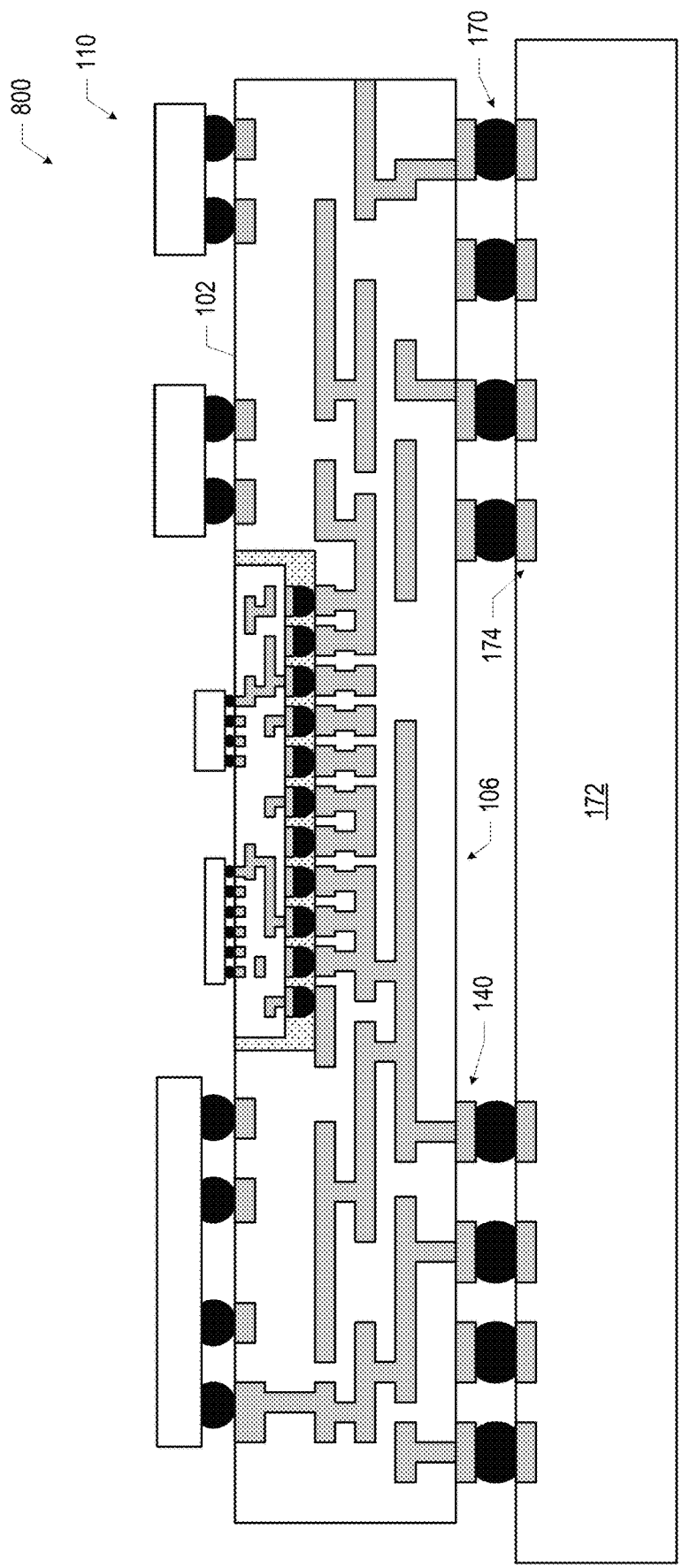

FIG. 8 illustrates a microelectronic assembly 800 subsequent to coupling the microelectronic assembly 110 (FIG. 7) to a circuit board 172. In particular, conductive contacts 140 at the second surface 106 of the LDMS 102 may be coupled to conductive contacts 174 on the circuit board 172 via interconnects 170 (which may include, e.g., solder). The circuit board 172 may be a motherboard, for example, and may have other components attached to it (not shown). The circuit board 172 may include conductive pathways and other conductive contacts (not shown) for routing power, ground, and signals through the circuit board 172, as known in the art.

Figure 9:
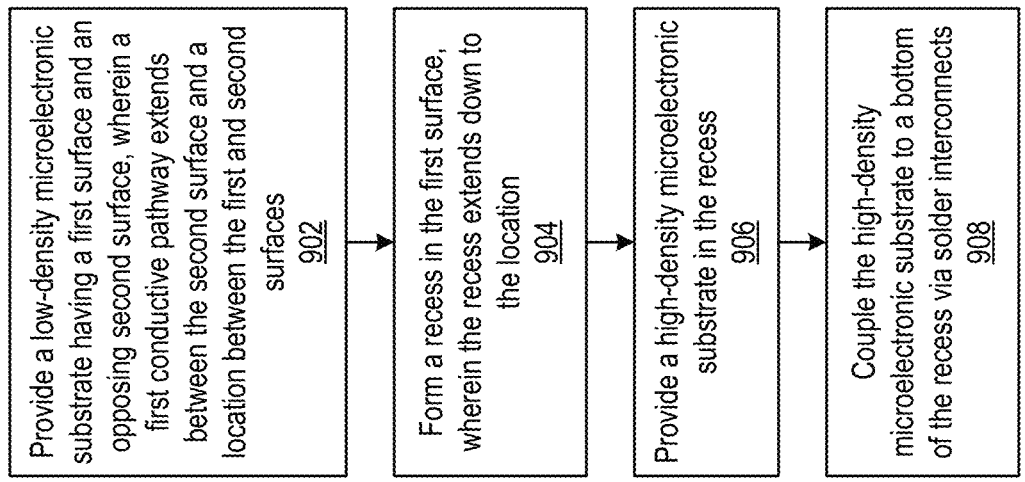
FIG. 9 is a flow diagram of a method of manufacturing a microelectronic assembly including an HMS, in accordance with various embodiments.

Any suitable technique may be used to manufacture the microelectronic assemblies disclosed herein. For example, FIG. 9 is a flow diagram of a method 900 of manufacturing a microelectronic assembly including an HMS, in accordance with various embodiments. Although the operations discussed below with reference to FIG. 9 may be illustrated by reference to various ones of FIGS. 2-8, any suitable microelectronic assemblies may be manufactured in accordance with the method 900. Additionally, although certain operations are described in a particular order, or as occurring only a single time, these operations may be interchanged, performed in parallel, or repeated as appropriate to manufacture a desired microelectronic assembly.

At 902, an LDMS may be provided. The LDMS may have a first surface and an opposing second surface, and the first conductive pathway may extend between the second surface and a location between the first and second surfaces. For example, the LDMS 200 of FIG. 2 may have a first surface 104, an opposing second surface 106, and a conductive pathway 132 that extends between the second surface 106 and the location of the conductive contacts 138 (between the first surface 104 and the second surface 106). Any suitable LDMS may be provided at 902, and any suitable technique may be used to manufacture that LDMS.

At 904, a recess may be formed in the first surface of the LDMS, extending down to the location. For example, the LDMS 102 of FIG. 3 may include a recess 108 that extends down to the conductive contacts 138. The recess formed at 904 may be formed using any suitable technique.

At 906, an HDMS may be provided in the recess, and at 908, the HDMS may be coupled to a bottom of the recess via solder interconnects. For example, the HDMS 114 of FIG. 5 may be provided in the recess 108 of the LDMS 102 and coupled to the bottom surface 112 of the recess 108 via the solder interconnects 160. Any suitable technique may be used at 906 and 908 to provide and couple the HDMS in the recess.

Figure 10:
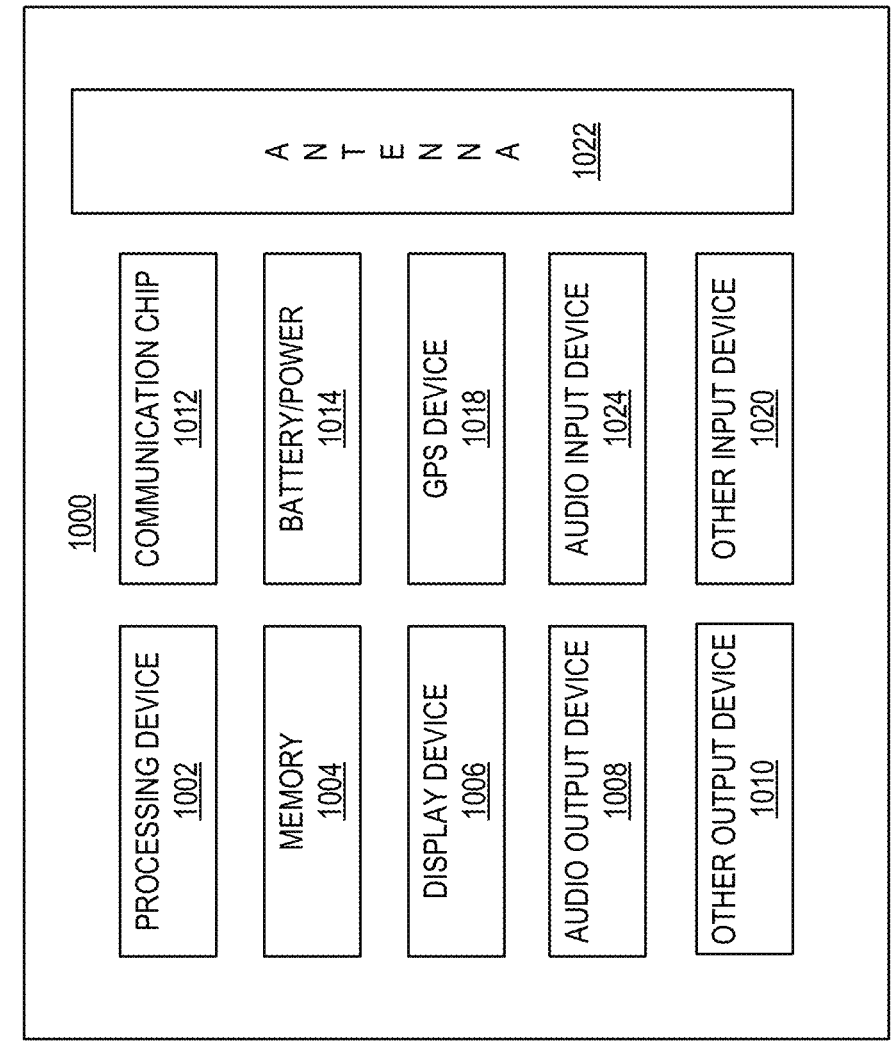
FIG. 10 is a block diagram of an example computing device that may include an HMS, in accordance with various embodiments.

Any of the embodiments of the HMS 100 disclosed therein (e.g., any microelectronic assemblies including one or more HMSs 100) may be used in any suitable electronic device. For example, FIG. 10 is a block diagram of an example computing device 1000 that may include an HMS 100 in accordance with the teachings of the present disclosure. In particular, any of the components of the computing device 1000 that may be implemented at least partially with a microelectronic device (e.g., a die) mounted to a substrate may include one or more embodiments of the HMS 100 (e.g., in the form of the microelectronic assembly 110 or 800). Alternatively or additionally, any of the components of the computing device 1000 that may be secured to a substrate may be secured to the HMS 100. A number of components are illustrated in FIG. 10 as included in the computing device 1000, but any one or more of these components may be omitted or duplicated, as suitable for the application. In some embodiments, some or all of these components are fabricated onto a single system-on-a-chip (SoC) die (e.g., included in a microelectronic device 126 or 148).

Additionally, in various embodiments, the computing device 1000 may not include one or more of the components illustrated in FIG. 8, but the computing device 1000 may include interface circuitry for coupling to the one or more components. For example, the computing device 1000 may not include a display device 1006, but may include display device interface circuitry (e.g., a connector and driver circuitry) to which a display device 1006 may be coupled. In another set of examples, the computing device 1000 may not include an audio input device 1024 or an audio output device 1008, but may include audio input or output device interface circuitry (e.g., connectors and supporting circuitry) to which an audio input device 1024 or audio output device 1008 may be coupled. Any one or more of the components of the computing device 1000 may include one or more HMSs 100.

The computing device 1000 may include a processing device 1002 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1002 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. In some embodiments, the processing device 1002 may be included in the HMS 100 (e.g., in the microelectronic device 126 or the microelectronic device 148). The computing device 1000 may include a memory 1004, which may itself include one or more memory devices such as volatile memory (e.g., dynamic random access memory (DRAM)), non-volatile memory (e.g., read-only memory (ROM)), flash memory, solid state memory, and/or a hard drive. In some embodiments, the memory 1004 may include memory that shares a die with the processing device 1002. This memory may be used as cache memory and may include embedded DRAM (eDRAM) or spin transfer torque magnetic RAM (STT-M RAM). The memory 1004 may be included in a microelectronic assembly (e.g., secured to an HMS 100, or otherwise included in the microelectronic assembly 800).

In some embodiments, the computing device 1000 may include a communication chip 1012 (e.g., one or more communication chips). For example, the communication chip 1012 may be configured for managing wireless communications for the transfer of data to and from the computing device 1000. The term "wireless" and its derivatives may be used to describe circuits, devices, systems, methods, techniques, communication channels, etc., that may communicate data through the use of modulated electromagnetic radiation through a nonsolid medium. The term does not imply that the associated devices do not contain any wires, although in some embodiments they might not. The communication chip 1012 may be included in a microelectronic assembly (e.g., secured to an HMS 100, or otherwise included in the microelectronic assembly 800).

The communication chip 1012 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra-mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1012 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1012 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1012 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1012 may operate in accordance with other wireless protocols in other embodiments. The computing device 1000 may include an antenna 1022 to facilitate wireless communications and/or to receive other wireless communications (such as AM or FM radio transmissions).

In some embodiments, the communication chip 1012 may manage wired communications, such as electrical, optical, or any other suitable communication protocols (e.g., Ethernet). As noted above, the communication chip 1012 may include multiple communication chips. For instance, a first communication chip 1012 may be dedicated to shorter-range wireless communications such as Wi-Fi or Bluetooth, and a second communication chip 1012 may be dedicated to longer-range wireless communications such as GPS, EDGE, GPRS, CDMA, WiMAX, LTE, EV-DO, or others. In some embodiments, a first communication chip 1012 may be dedicated to wireless communications, and a second communication chip 1012 may be dedicated to wired communications.

The computing device 1000 may include battery/power circuitry 1014. The battery/power circuitry 1014 may include one or more energy storage devices (e.g., batteries or capacitors) and/or circuitry for coupling components of the computing device 1000 to an energy source separate from the computing device 1000 (e.g., AC line power). Some or all of the battery/power circuitry 1014 may include a microelectronic assembly (e.g., one or more microelectronic devices secured to an HMS 100, or otherwise included in the microelectronic assembly 800), as noted above.

The computing device 1000 may include a display device 1006 (or corresponding interface circuitry, as discussed above). The display device 1006 may include any visual indicators, such as a heads-up display, a computer monitor, a projector, a touchscreen display, a liquid crystal display (LCD), a light-emitting diode display, or a flat panel display, for example.

The computing device 1000 may include an audio output device 1008 (or corresponding interface circuitry, as discussed above). The audio output device 1008 may include any device that generates an audible indicator, such as speakers, headsets, or earbuds, for example.

The computing device 1000 may include an audio input device 1024 (or corresponding interface circuitry, as discussed above). The audio input device 1024 may include any device that generates a signal representative of a sound, such as microphones, microphone arrays, or digital instruments (e.g., instruments having a musical instrument digital interface (MIDI) output).

The computing device 1000 may include a global positioning system (GPS) device 1018 (or corresponding interface circuitry, as discussed above). The GPS device 1018 may be in communication with a satellite-based system and may receive a location of the computing device 1000, as known in the art. Some or all of the GPS device 1018 may include a microelectronic assembly (e.g., with one or more microelectronic devices secured to an HMS 100, or otherwise included in the microelectronic assembly 800), as noted above.

The computing device 1000 may include an other output device 1010 (or corresponding interface circuitry, as discussed above). Examples of the other output device 1010 may include an audio codec, a video codec, a printer, a wired or wireless transmitter for providing information to other devices, or an additional storage device.

The computing device 1000 may include an other input device 1020 (or corresponding interface circuitry, as discussed above). Examples of the other input device 1020 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

Generally, the computing device 1000 may include any components found in conventional computing devices. For example, the computing device 1000 may include a platform controller hub (which may include or be mounted on any of the hybrid microelectronic substrates disclosed herein). The computing device 1000 may have any desired form factor, such as a hand-held or mobile computing device (e.g., a cell phone, a smart phone, a mobile internet device, a music player, a tablet computer, a laptop computer, a netbook computer, an ultrabook computer, a personal digital assistant (PDA), an ultra-mobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, the computing device 1000 may be any other electronic device that processes data.

The following paragraphs provide various examples of the embodiments disclosed herein. Example 1 is a hybrid microelectronic substrate, including: a low-density microelectronic substrate (LDMS) having a recess at a first surface; and a high-density microelectronic substrate (HDMS) disposed in the recess and coupled to a bottom surface of the recess via solder interconnects.

Example 2 may include the subject matter of Example 1, and may further include an underfill material disposed around the solder interconnects between the HDMS and the bottom surface of the recess.

Example 3 may include the subject matter of Example 2, and may further specify that the underfill material is an epoxy flux.

Example 4 may include the subject matter of any of Examples 1-3, and may further specify that: the LDMS includes a first conductive pathway that extends to the bottom surface of the recess; the HDMS has a first surface and an opposing second surface; the second surface of the HDMS is disposed between the first surface of the HDMS and the bottom surface of the recess; the HDMS has a first conductive contact disposed at the second surface of the HDMS; and the first conductive contact is coupled to the first conductive pathway via a solder interconnect.

Example 5 may include the subject matter of Example 4, and may further specify that the LDMS has a second surface opposite to the first surface of the LDMS; and the first conductive pathway extends to the second surface of the LDMS.

Example 6 may include the subject matter of Example 5, and may further include a second conductive contact disposed at the second surface of the LDMS and coupled to the first conductive pathway.

Example 7 may include the subject matter of any of Examples 4-6, and may further specify that the first conductive pathway includes a filled via.

Example 8 may include the subject matter of any of Examples 4-7, and may further specify that the HDMS includes a second conductive pathway that extends between the first surface of the HDMS and the first conductive contact.

Example 9 may include the subject matter of Example 8, and may further include a third conductive contact disposed at the first surface of the HDMS.

Example 10 may include the subject matter of any of Examples 1-9, and may further specify that the recess has a depth between 50 and 150 microns.

Example 11 may include the subject matter of any of Examples 1-10, and may further specify that the recess extends through at least two layers of dielectric material in the LDMS.

Example 12 may include the subject matter of any of Examples 1-11, and may further specify that the LDMS is a printed circuit board (PCB).

Example 13 may include the subject matter of any of Examples 1-12, and may further specify that the HDMS includes lines and spaces having a pitch less than 20 microns.

Example 14 may include the subject matter of any of Examples 1-13, and may further specify that the LDMS includes FR-4.

Example 15 may include the subject matter of Example 14, and may further specify that the HDMS includes a dielectric buildup film.

Example 16 may include the subject matter of any of Examples 1-15, and may further specify that the LDMS includes lines and spaces having a pitch greater than 40 microns.

Example 17 is a computing device, including: a hybrid microelectronic substrate including a first microelectronic substrate having a recess at a first surface, and a second microelectronic substrate disposed in the recess, wherein the second microelectronic substrate has a first surface and an opposing second surface, and wherein the second surface of the second microelectronic substrate is coupled to a bottom surface of the recess via solder interconnects; and a microelectronic device coupled to the first surface of the second microelectronic substrate.

Example 18 may include the subject matter of Example 17, and may further specify that the second microelectronic substrate includes a first plurality of conductive contacts at the first surface of the second microelectronic substrate, and a corresponding second plurality of conductive contacts of the microelectronic device are coupled to the first plurality of conductive contacts.

Example 19 may include the subject matter of Example 18, and may further specify that the first plurality of conductive contacts have a pitch less than 40 microns.

Example 20 may include the subject matter of any of Examples 18-19, and may further specify that the second plurality of conductive contacts include copper bumps or pillars.

Example 21 may include the subject matter of any of Examples 17-20, and may further specify that the hybrid microelectronic substrate has a thickness that is between 0.25 and 0.75 millimeters.

Example 22 may include the subject matter of any of Examples 17-21, and may further specify that the first microelectronic device substrate is a printed circuit board (PCB).

Example 23 may include the subject matter of any of Examples 17-22, and may further specify that the hybrid microelectronic substrate includes conductive pathways to route power and ground signals to the microelectronic device.

Example 24 may include the subject matter of any of Examples 17-23, and may further specify that the microelectronic device is a flip chip die.

Example 25 may include the subject matter of any of Examples 17-24, and may further specify that the microelectronic device includes a processing device, a memory device, or a platform controller hub.

Example 26 is a method of manufacturing a microelectronic assembly including a hybrid microelectronic substrate, including: providing a low-density microelectronic substrate (LDMS) having a first surface and an opposing second surface, wherein a first conductive pathway extends between the second surface and a location between the first and second surfaces; forming a recess in the first surface, wherein the recess extends down to the location; providing a high-density microelectronic substrate (HDMS) in the recess; and coupling the HDMS to a bottom surface of the recess via solder interconnects.

Example 27 may include the subject matter of Example 26, and may further specify that forming the recess includes laser-drilling the recess.

Example 28 may include the subject matter of Example 26, and may further specify that forming the recess includes mechanically drilling the recess.

Example 29 may include the subject matter of any of Examples 26-28, and may further specify that coupling the HDMS to the bottom surface of the recess via solder interconnects includes performing a surface mount mass reflow process.

Example 30 may include the subject matter of any of Examples 26-29, and may further specify that coupling the HDMS to the bottom surface of the recess via solder interconnects includes thermal compression bonding the HDMS to the LDMS.

Example 31 may include the subject matter of any of Examples 26-30, and may further specify that the HDMS has a first surface and an opposing second surface, the second surface of the HDMS is disposed between the first surface of the HDMS and the bottom surface of the recess after the HDMS is coupled to the bottom surface of the recess via solder interconnects, and the method further comprises coupling a microelectronic device to the first surface of the HDMS.

Example 32 may include the subject matter of any of Examples 26-31, and may further include, after coupling the HDMS to the bottom surface of the recess via solder interconnects, providing an underfill material between the HDMS and the LDMS.

The invention claimed is:

1. A hybrid microelectronic substrate, comprising:
a low-density microelectronic substrate (LDMS) having a recess at a first surface, wherein the LDMS includes a first conductive pathway that extends to a bottom surface of the recess, and the LDMS is a printed circuit board (PCB); and
a high-density microelectronic substrate (HDMS) at least partially in the recess and coupled to the bottom surface of the recess via solder interconnects, wherein the HDMS has a first surface and an opposing second surface, the first surface of the HDMS is between the second surface of the HDMS and the bottom surface of the recess, the HDMS has a first conductive contact at the first surface of the HDMS, the first conductive contact is coupled to the first conductive pathway via a solder interconnect, the HDMS includes a second conductive pathway that extends between the second surface of the HDMS and the first conductive contact, the HDMS has a second conductive contact at the second surface of the HDMS, the HDMS does not include a semiconductor layer, the HDMS includes a stack of layers of dielectric material, and the stack extends from the first surface of the HDMS to the second surface of the HDMS.

2. The hybrid microelectronic substrate of claim 1, further comprising:
an underfill material between the HDMS and the bottom surface of the recess.

3. The hybrid microelectronic substrate of claim 2, wherein the underfill material includes an epoxy.

4. The hybrid microelectronic substrate of claim 2, wherein the underfill does not extend onto the second surface of the HDMS.

5. The hybrid microelectronic substrate of claim 1, wherein:
the LDMS has a second surface opposite to the first surface of the LDMS; and
the first conductive pathway extends to the second surface of the LDMS.

6. The hybrid microelectronic substrate of claim 5, further comprising:
a second conductive contact at the second surface of the LDMS and coupled to the first conductive pathway.

7. The hybrid microelectronic substrate of claim 1, wherein the first conductive pathway includes a filled via.

8. The hybrid microelectronic substrate of claim 1, wherein the recess has a depth between 50 and 150 microns.

9. The hybrid microelectronic substrate of claim 1, wherein the HDMS includes lines and spaces having a pitch less than 20 microns, and the LDMS includes lines and spaces having a pitch greater than 40 microns.

10. The hybrid microelectronic substrate of claim 1, wherein the LDMS includes FR-4.

11. The hybrid microelectronic substrate of claim 1, wherein the recess extends through at least two dielectric material layers of the PCB.

12. The hybrid microelectronic substrate of claim 1, wherein the first conductive pathway extends through at least two dielectric material layers of the PCB.

13. The hybrid microelectronic substrate of claim 1, wherein the HDMS includes a dielectric buildup film.

14. The hybrid microelectronic substrate of claim 1, wherein the first conductive pathway includes at least one via and at least one line.

15. A hybrid microelectronic substrate, comprising:
a low-density microelectronic substrate (LDMS) having a recess at a first surface, wherein the LDMS includes a first conductive pathway that extends to a bottom surface of the recess; and
a high-density microelectronic substrate (HDMS) in the recess and coupled to the bottom surface of the recess via solder interconnects, wherein the HDMS has a first surface and an opposing second surface, the first surface of the HDMS is between the second surface of the HDMS and the bottom surface of the recess, the HDMS has a first conductive contact at the first surface of the HDMS, the first conductive contact is coupled to the first conductive pathway via a solder interconnect, the HDMS includes a second conductive pathway, the HDMS has a second conductive contact at the second surface of the HDMS, the second conductive contact is coupled to the second conductive pathway, the HDMS includes a stack of layers of dielectric material, and the stack extends from the first surface of the HDMS to the second surface of the HDMS.

16. The hybrid microelectronic substrate of claim 15, further comprising:
an underfill material between the HDMS and the bottom surface of the recess.

17. The hybrid microelectronic substrate of claim 16, wherein the underfill does not extend onto the second surface of the HDMS.

18. The hybrid microelectronic substrate of claim 15, wherein the recess extends through at least two layers of dielectric material in the LDMS.

19. The hybrid microelectronic substrate of claim 15, wherein the first conductive pathway includes at least one via and at least one line.

20. The hybrid microelectronic substrate of claim 15, wherein the HDMS includes lines and spaces having a pitch less than 20 microns.

* * * * *